(12) United States Patent
Iizuka et al.

(10) Patent No.: US 11,929,709 B2
(45) Date of Patent: *Mar. 12, 2024

(54) OVEN-CONTROLLED CRYSTAL OSCILLATOR

(71) Applicant: DAISHINKU CORPORATION, Kakogawa (JP)

(72) Inventors: Minoru Iizuka, Kakogawa (JP); Takuya Kojo, Kakogawa (JP); Yoshinari Morimoto, Kakogawa (JP)

(73) Assignee: DAISHINKU CORPORATION, Kakogawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/770,028

(22) PCT Filed: Feb. 22, 2021

(86) PCT No.: PCT/JP2021/006579
§ 371 (c)(1),
(2) Date: Apr. 18, 2022

(87) PCT Pub. No.: WO2021/199790
PCT Pub. Date: Oct. 7, 2021

(65) Prior Publication Data
US 2022/0393643 A1  Dec. 8, 2022

(30) Foreign Application Priority Data
Mar. 30, 2020  (JP) ................. 2020-060353

(51) Int. Cl.
*H03B 5/04* (2006.01)
*H03B 5/32* (2006.01)

(52) U.S. Cl.
CPC ............. *H03B 5/04* (2013.01); *H03B 5/32* (2013.01)

(58) Field of Classification Search
CPC ...................................................... H03B 5/04
USPC ............................................................ 331/70
See application file for complete search history.

(56) References Cited

U.S. PATENT DOCUMENTS

| | | | |
|---|---|---|---|
| 6,501,340 B1 * | 12/2002 | Flood | H03L 1/04 310/318 |
| 2016/0322952 A1 | 11/2016 | Iizuka et al. | |
| 2017/0111010 A1 | 4/2017 | Kondo | |
| 2018/0234052 A1 | 8/2018 | Noto | |
| 2018/0302033 A1 | 10/2018 | Yamazaki et al. | |
| 2018/0337634 A1 * | 11/2018 | Kondo | H01L 41/09 |
| 2020/0382096 A1 | 12/2020 | Fujiwara | |

FOREIGN PATENT DOCUMENTS

| | | |
|---|---|---|
| CN | 108432126 A | 8/2018 |
| JP | 2009-302701 A | 12/2009 |
| JP | 2010-183227 A | 8/2010 |
| JP | 2015-139053 A | 7/2015 |

(Continued)

*Primary Examiner* — Joseph Chang
(74) *Attorney, Agent, or Firm* — METROLEX IP LAW GROUP, PLLC

(57) ABSTRACT

An oven-controlled crystal oscillator according to one or more embodiments may include a core section having a crystal resonator, an oscillator IC and a heating IC, wherein the core section is supported by a package via an interposer, and furthermore the core section is hermetically encapsulated in the package.

13 Claims, 13 Drawing Sheets

(56) References Cited

FOREIGN PATENT DOCUMENTS

| JP | 2017-79348 A | 4/2017 |
|---|---|---|
| JP | 2017-130862 A | 7/2017 |
| JP | 6376681 B2 | 8/2018 |
| TW | 201939888 A | 10/2019 |
| WO | 2017/068839 A1 | 4/2017 |

* cited by examiner

OVEN-CONTROLLED CRYSTAL OSCILLATOR

TECHNICAL FIELD

The present invention relates to an oven-controlled crystal oscillator.

BACKGROUND ART

In a piezoelectric resonator such as a crystal resonator, the vibration frequency changes depending on the temperature according to its frequency temperature characteristics. In order to keep the temperature around the piezoelectric resonator constant, an oven-controlled crystal (Xtal) oscillator (hereinafter also referred to as an "OCXO") is known. It has a configuration in which a piezoelectric resonator is encapsulated in a thermostatic oven (for example, see Patent Document 1).

PRIOR ART DOCUMENT

Patent Document

[Patent Document 1] JP 6376681

SUMMARY OF THE INVENTION

Problem to be Solved by the Invention

In the OCXO as described above, it is necessary to perform temperature control of a heating element and piezoelectric vibration of the piezoelectric resonator both with high accuracy. Conventionally, a single IC (for example, an OCXO-IC) performs both the temperature control of the heating element and the piezoelectric vibration control of the piezoelectric resonator. Thus, such an expensive IC is required for the OCXO, which may increase production costs of the OCXO.

The present invention was made in consideration of the above circumstances, an object of which is to provide an oven-controlled crystal oscillator that performs the temperature control of the heating element and the piezoelectric vibration control of the piezoelectric resonator both with high accuracy while reducing costs.

Means for Solving the Problem

In order to achieve the above object, an oven-controlled crystal oscillator of the present invention includes a core section having a piezoelectric resonator, an oscillator IC and a heating element. The core section is supported by a package via a core substrate, and furthermore is hermetically encapsulated in the package. Here, the heating element may be a heater IC and/or a thin-film heater. That is, the core section may be provided with the heater IC and the thin-film heater, or may be provided with only the heater IC, or also may be provided with only the thin-film heater. When the core section is provided with only the heater IC, it is preferable to use a heater IC that has a configuration in which a heating element (a heat source), a control circuit for controlling the temperature of the heating element (a current control circuit) and a temperature sensor for detecting the temperature of the heating element are integrally formed. When the core section is provided with only the thin-film heater, it is preferable that an IC for adjusting the temperature of the thin-film heater is provided separately from the core section.

With the above-described configuration, since the core section is encapsulated in the package, it is possible to reduce temperature change of the piezoelectric resonator of the core section as much as possible even when the outside temperature changes. Thus, the temperature adjustment by an OCXO can be performed in the small temperature range, which leads to simple components required for temperature adjustment and thus results in reduction in costs. Furthermore, since the IC (for example, the heater IC) that mainly controls the temperature of the heating element is used together with the oscillator IC that mainly controls the piezoelectric vibration of the piezoelectric resonator, the temperature control of the heating element as well as the piezoelectric vibration control of the piezoelectric resonator can be both performed with high accuracy. As a result, it is possible to remarkably reduce the costs compared to the case where an IC (for example, an OCXO-IC), which is capable of performing both the temperature control of the heating element and the piezoelectric vibration control of the piezoelectric resonator, is used.

In the above-described configuration, it is preferable that the package is provided with a recess part whose upper part is opened, and that the core section is supported by the core substrate so as to be hung inside the package.

With the above-described configuration, it is possible to reduce the height of the OCXO by supporting the core section in the package using the core substrate. Consequently, it is possible to reduce the heat capacity of the OCXO, which leads to the temperature adjustment with high accuracy by the OCXO.

In the above-described configuration, it is preferable that a pair of step parts facing each other is formed inside the package. Also, it is preferable that the core substrate is disposed so as to be bridged between the pair of step parts, and that the core section is disposed so as to be housed in a space between the pair of step parts.

With the above-described configuration, it is possible to easily fix the core substrate to the package using the step parts of the package. Also, it is possible to further reduce the height of the OCXO by housing the core section in the space between the pair of step parts in the package. Consequently, it is possible to reduce the heat capacity of the OCXO, which leads to the temperature adjustment with high accuracy by the OCXO.

In the above-described configuration, it is preferable that the core substrate is fixed to the pair of step parts via a polyimide conductive adhesive.

The package suffers heat damage and over time damage due to hermetical sealing, aging, deterioration over time and the like. Thus, when resin adhesive with low heat resistance is used as the conductive adhesive, it may generate gas in the package by decomposition or softening, which may affect high accuracy in the temperature adjustment by the OCXO. In the above-described configuration, since the polyimide adhesive with low thermal conductivity and high heat resistance is used as the conductive adhesive, it is possible to prevent the above problems.

In the above-described configuration, it is preferable that the piezoelectric resonator includes: a first sealing member and a second sealing member both made of glass or crystal; and a piezoelectric resonator plate made of crystal, which has a vibrating part and excitation electrodes formed on respective main surfaces of the vibrating part. Also it is preferable that the first sealing member and the second sealing member are laminated and bonded to each other via the piezoelectric resonator plate so as to hermetically seal the vibrating part of the piezoelectric resonator plate in an internal space.

With the above-described configuration, the piezoelectric resonator is used, which has a sandwich structure and thus is capable of having a reduced height. Accordingly, it is possible to reduce the height and the size of the core section. In this way, the heat capacity of the core section can be reduced, which leads to the temperature adjustment with high accuracy by the OCXO.

Effects of the Invention

With the present invention, since the core section is encapsulated in the package, it is possible to reduce temperature change of the piezoelectric resonator of the core section as much as possible even when the outside temperature changes. Thus, the temperature adjustment by an OCXO can be performed in the small temperature range, which leads to simple components required for the temperature adjustment and thus results in reduction in costs. Furthermore, since an IC that mainly controls the temperature of the heating element is used together with an oscillator IC that mainly controls the piezoelectric vibration of the piezoelectric resonator, the temperature control of the heating element as well as the piezoelectric vibration control of the piezoelectric resonator can be both performed with high accuracy. As a result, it is possible to remarkably reduce the costs compared to the case where an IC (for example, an OCXO-IC), which is capable of performing both the temperature control of the heating element and the piezoelectric vibration control of the piezoelectric resonator, is used.

MODE FOR CARRYING OUT THE INVENTION

Hereinafter, an embodiment of the present invention will be described with reference to the drawings.

Figure 1:
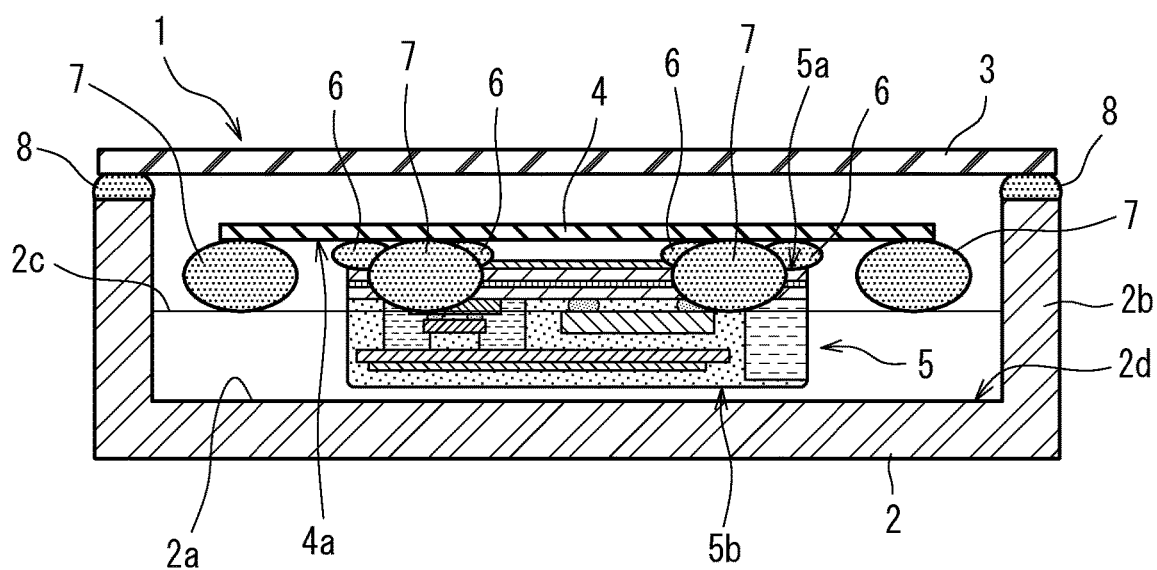
FIG. 1 is a cross-sectional view illustrating a schematic configuration of an OCXO according to an embodiment.

As shown in FIG. 1, an OCXO 1 according to this embodiment has a configuration in which a core section 5 is disposed in a package (housing) 2 made of ceramic or the like and having a substantially rectangular parallelepiped shape such that the core section 5 is hermetically sealed by a lid 3. The package 2 includes a recess part 2a whose upper part is opened, and the core section 5 is hermetically encapsulated in the recess part 2a. To an upper surface of a peripheral wall part 2b that surrounds the recess part 2a, the lid 3 is fixed by a sealant 8. Thus, the inside of the package 2 is hermetically sealed. As the sealant 8, a metal sealant such as Au—Su alloy or solder is suitably used, however, other sealants including low melting point glass may also be used. The space inside the package 2 is preferably a vacuum atmosphere or an atmosphere with low thermal conductivity with low pressure nitrogen or low pressure argon.

Step parts 2c are formed on an inner wall surface of the peripheral wall part 2b of the package 2 so as to be along the arrangement of connection terminals (not shown). The core section 5 is connected to the connection terminals formed on the step parts 2c via a plate-like interposer (core substrate) 4. More specifically, the connection terminals formed on the step surfaces of the step parts 2c are connected to connection terminals formed on a front surface (in FIG. 1, the lower surface) 4a of the interposer 4 via a conductive adhesive 7. Also, external terminals (not shown) formed on a bottom surface (in FIG. 1, the upper surface) 5a of the core section 5 are connected to the connection terminals formed on the front surface 4a of the interposer 4 via a conductive adhesive 6. The external terminals on the bottom surface 5a of the core section 5 are formed in a region where no metal wiring 54a (described later) is formed on the bottom surface 5a of the core section 5. A polyimide adhesive or an epoxy adhesive is used, for example, as the conductive adhesives 6 and 7.

The interposer 4 is disposed so as to be bridged between a facing pair of step parts 2c of the package 2. The core section 5 is disposed so as to be housed in a space between the pair of step parts 2c. A gap is formed between a top surface (in FIG. 1, lower surface) 5b of the core section 5 and a bottom surface 2d of the recess part 2a of the package 2. Thus, the core section 5 is fixed to the interposer 4 in an upside down manner relative to the state shown in FIG. 2. Furthermore, the core section 5 is supported by the interposer 4 so as to be hung inside the package 2.

Figure 2:
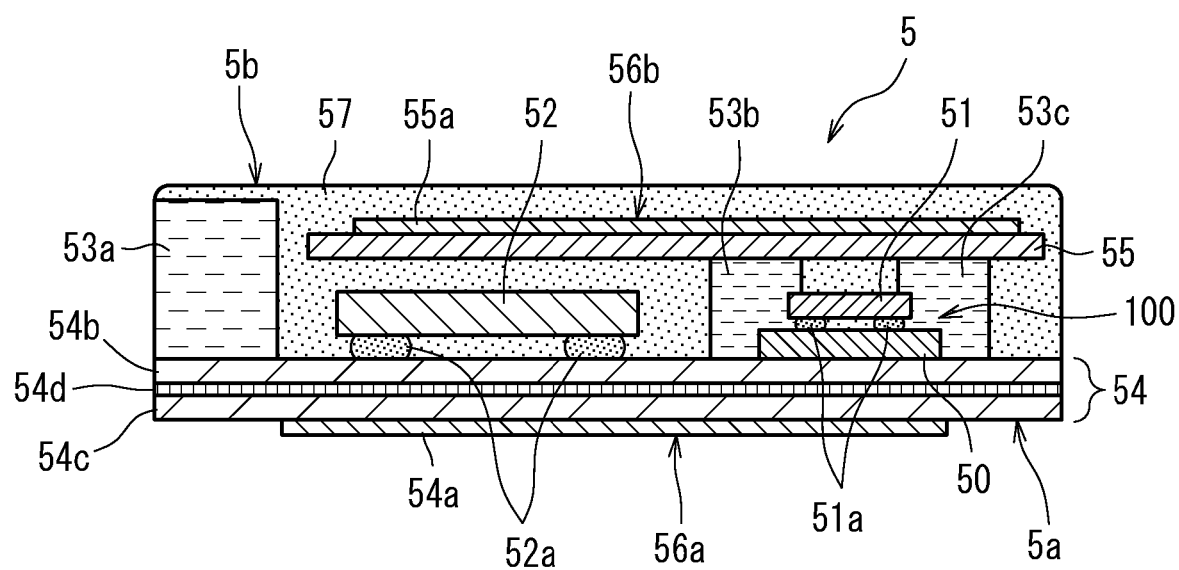
FIG. 2 is a cross-sectional view illustrating a schematic configuration of a core section of the OCXO of FIG. 1.
Figure 3:
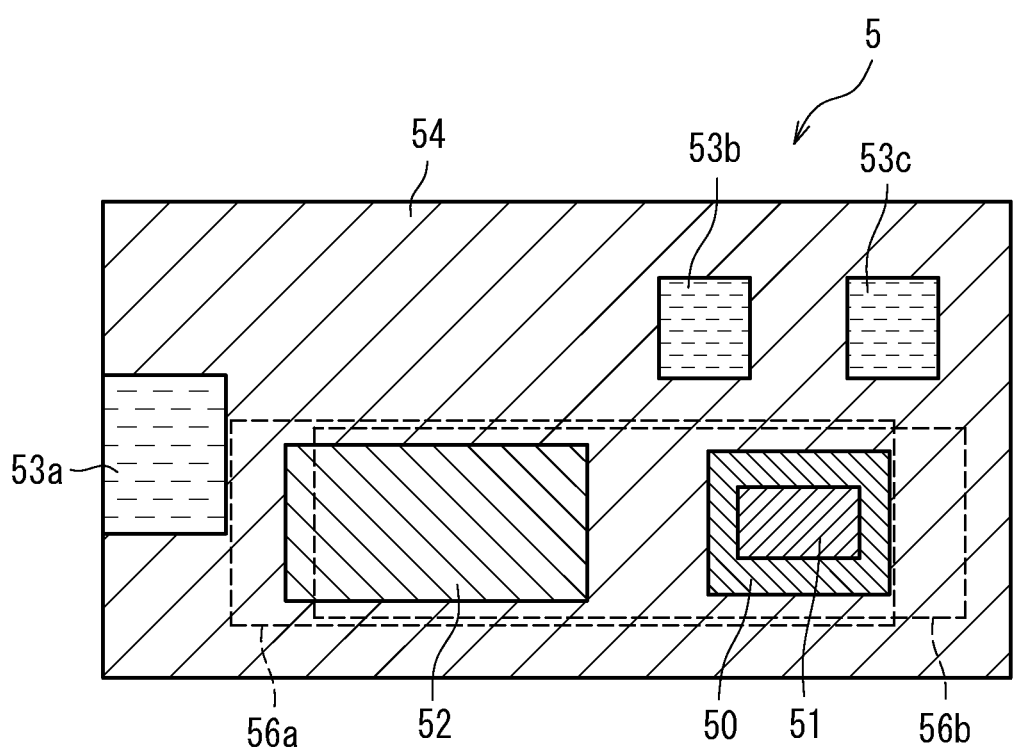
FIG. 3 is a plan view illustrating the core section of FIG. 2.

Here, the core section 5 is described referring to FIGS. 2 and 3. In FIG. 2, the bottom surface 5a of the core section 5 is disposed on the lower side while the top surface 5b of the core section 5 is disposed on the upper side (i.e. the upside down state relative to the state illustrated in FIG. 1).

The core section 5 packages various electronic components used for the OCXO 1 such as a crystal resonator 50, an oscillator IC 51, a heater IC 52, and a chip capacitors (bypass capacitors) 53a to 53c. These components are hermetically sealed by a sealing resin 57 on a crystal substrate 54. The core section 5 stabilizes oscillation frequency of the OCXO 1 by especially adjusting the temperatures of the crystal resonator 50, the oscillator IC 51 and the heater IC 52, whose temperature characteristics are large. It is preferable that the electronic components of the core section 5 are sealed by the sealing resin 57, however, depending on the sealing atmosphere, the electronic components are not needed to be sealed by the sealing resin. For example, if the sealing atmosphere is an inert gas atmosphere, it is not necessary to seal the electronic components by the sealing resin. In place of that, the electronic components used for the OCXO 1 may be covered to reduce influence caused by thermal convection.

A crystal oscillator 100 is constituted of the crystal resonator 50 and the oscillator IC 51. The oscillator IC 51 is mounted on the crystal resonator 50 via a plurality of metal bumps 51a. The oscillation frequency of the OCXO 1 is controlled by controlling the piezoelectric vibration of the crystal resonator 50 by the oscillator IC 51. The heater IC 52 is an IC to adjust the temperature of the core section 5. Specifically, it controls the current applied to thin-film heaters (heater substrates) 56a and 56b used for the core section 5. The heater IC 52 is mounted on the crystal substrate 54 via a plurality of metal bumps 52a.

The core section 5 has upper and lower two crystal substrates 54 and 55 facing each other. Metal wirings 54a and 55a are respectively formed on the crystal substrates 54 and 55 so as to be used as the thin-film heaters 56a and 56b. Thus, the thin-film heaters 56a and 56b are respectively configured by laminating, by vapor deposition, the metal wirings 54a and 55a as the resistive films on the surfaces of the crystal substrates 54 and 55 as the base materials. The regions in which the metal wirings 54a and 55a are formed on the respective crystal substrates 54 and 55 serve as the thin-film heaters (heater substrates) 56a and 56b for adjusting the temperature.

In FIG. 3, the crystal substrate 55 and the metal wiring 55a on the upper side are omitted, and respective heating regions of the upper and lower thin-film heaters 56a and 56b are shown as the frames indicted by the broken lines. Also, the crystal substrate 54 shown in FIG. 2 is a layered substrate made of two crystal plates 54b and 54c, and an internal wiring 54d is inserted into the two crystal plates 54b and 54c of the crystal substrate 54, which is mainly electrically connected to the heater IC 52. The internal wiring 54d is electrically connected to external terminals (not shown) formed on the bottom surface of the crystal substrate 54, and furthermore electrically connected to the outside via the above-described interposer 4 and the package 2. However, the present invention is not limited thereto. The crystal substrate 54 may be a single layer substrate made of one crystal plate. In this embodiment, the upper and lower thin-film heaters 56a and 56b have the shapes and the heating regions slightly different from each other, however, the upper and lower thin-film heaters 56a and 56b may have the same shape and thus have the same heating region.

The core section 5 has a configuration in which the crystal resonator 50, the oscillator IC 51 and the heater IC 52, respective temperature characteristics of which are large, are disposed between the upper and lower two crystal substrates 54 and 55. More specifically, in the core section 5, the crystal resonator 50, the oscillator IC 51 and the heater IC 52 are interposed between the upper and lower two thin-film heaters (heater substrates) 56a and 56b for adjusting the temperature. In other words, the crystal resonator 50, the oscillator IC 51 and the heater IC 52 are disposed between the thin-film heater 56a formed on the lower crystal substrate 54 and the thin-film heater 56b formed on the upper crystal substrate 55. The lower thin-film heater 56a is disposed so as to cover below the crystal resonator 50, the oscillator IC 51 and the heater IC 52, and the upper thin-film heater 56b is disposed so as to cover above the crystal resonator 50, the oscillator IC 51 and the heater IC 52. Here, the term "cover" means that the large (or all) part of the crystal resonator 50, the oscillator IC 51 and the heater IC 52 are superimposed on the crystal substrates 54 and 55 in plan view, which excludes the case where part of (for example, several to twenty or thirty percent of) the above elements are only superimposed on the crystal substrates 54 and 55.

Also, two chip capacitors 53b and 53c among the chip capacitors 53a to 53c are sandwiched between the upper and lower two thin-film heaters (heater substrates) 56a and 56b. The chip capacitors 53b and 53c each having relatively small size are mounted on the lower crystal substrate 54, and the front surfaces of the chip capacitors 53b and 53c come into contact with the upper crystal substrate 55. The chip capacitor 53a having the largest size is mounted on the lower crystal substrate 54, but not covered with the upper crystal substrate 55.

Although the kind of the crystal resonator 50 is not particularly limited, a device having a sandwich structure is suitably adopted, which can be easily made thinner. The device having the sandwich structure is constituted of: a first sealing member and a second sealing member both made of glass or crystal; and a piezoelectric resonator plate made of, for example, crystal. The piezoelectric resonator plate has a vibrating part, on respective main surfaces of which excitation electrodes are formed. The first sealing member and the second sealing member are laminated and bonded to each other via the piezoelectric resonator plate. Thus, the vibrating part of the piezoelectric resonator plate is hermetically sealed in an internal space.

The crystal oscillator 100 having the sandwich-structured crystal resonator 50 is described referring to FIGS. 4 to 10.

Figure 4:
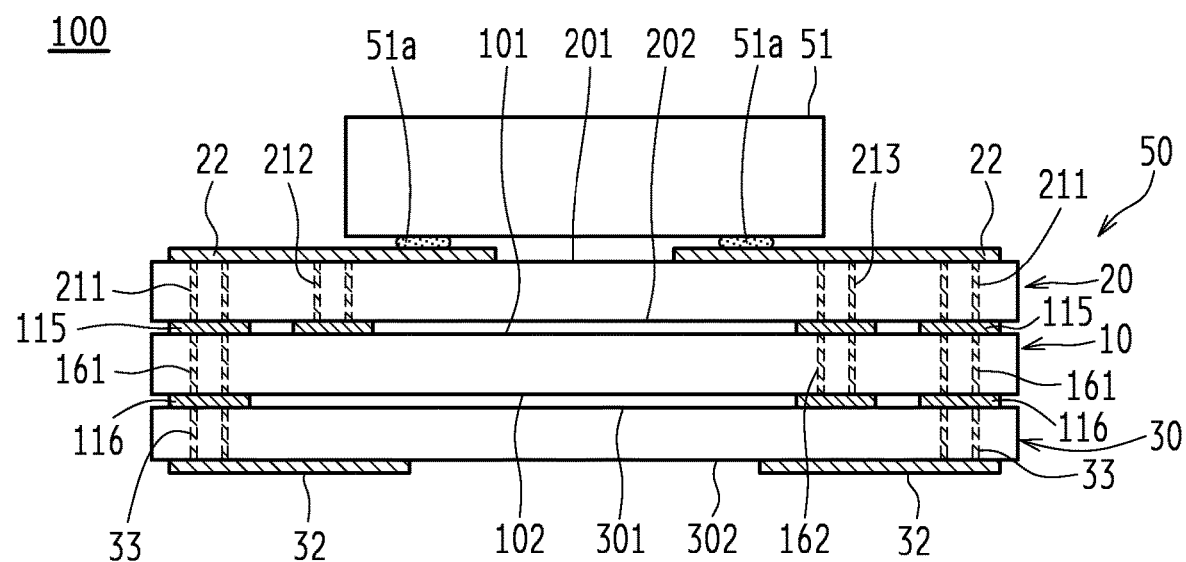
FIG. 4 is a schematic configuration diagram schematically illustrating a configuration of a crystal oscillator of the core section of FIG. 2.

As shown in FIG. 4, the crystal oscillator 100 includes: a crystal resonator plate (piezoelectric resonator plate) 10; a first sealing member 20; a second sealing member 30; and an oscillator IC 51. In this crystal oscillator 100, the crystal resonator plate 10 is bonded to the first sealing member 20, and furthermore the crystal resonator plate 10 is bonded to the second sealing member 30. Thus, a package having a sandwich structure is formed so as to have a substantially rectangular parallelepiped shape. In the crystal oscillator 100, the first sealing member 20 and the second sealing member 30 are bonded to respective main surfaces of the crystal resonator plate 10, thus an internal space (cavity) of the package is formed. In this internal space, a vibrating part 11 (see FIGS. 7 and 8) is hermetically sealed.

The crystal oscillator 100 has, for example, a package size of 1.0×0.8 mm, which is reduced in size and height. According to the size reduction, no castellation is formed in the package. Through holes are used for conduction between electrodes. The oscillator IC 51 mounted on the first sealing member 20 is a one-chip integrated circuit element constituting, with the crystal resonator plate 10, an oscillation circuit. Also, the crystal oscillator 100 is mounted on the above-described crystal substrate 54 via solder or the like.

Figure 7:
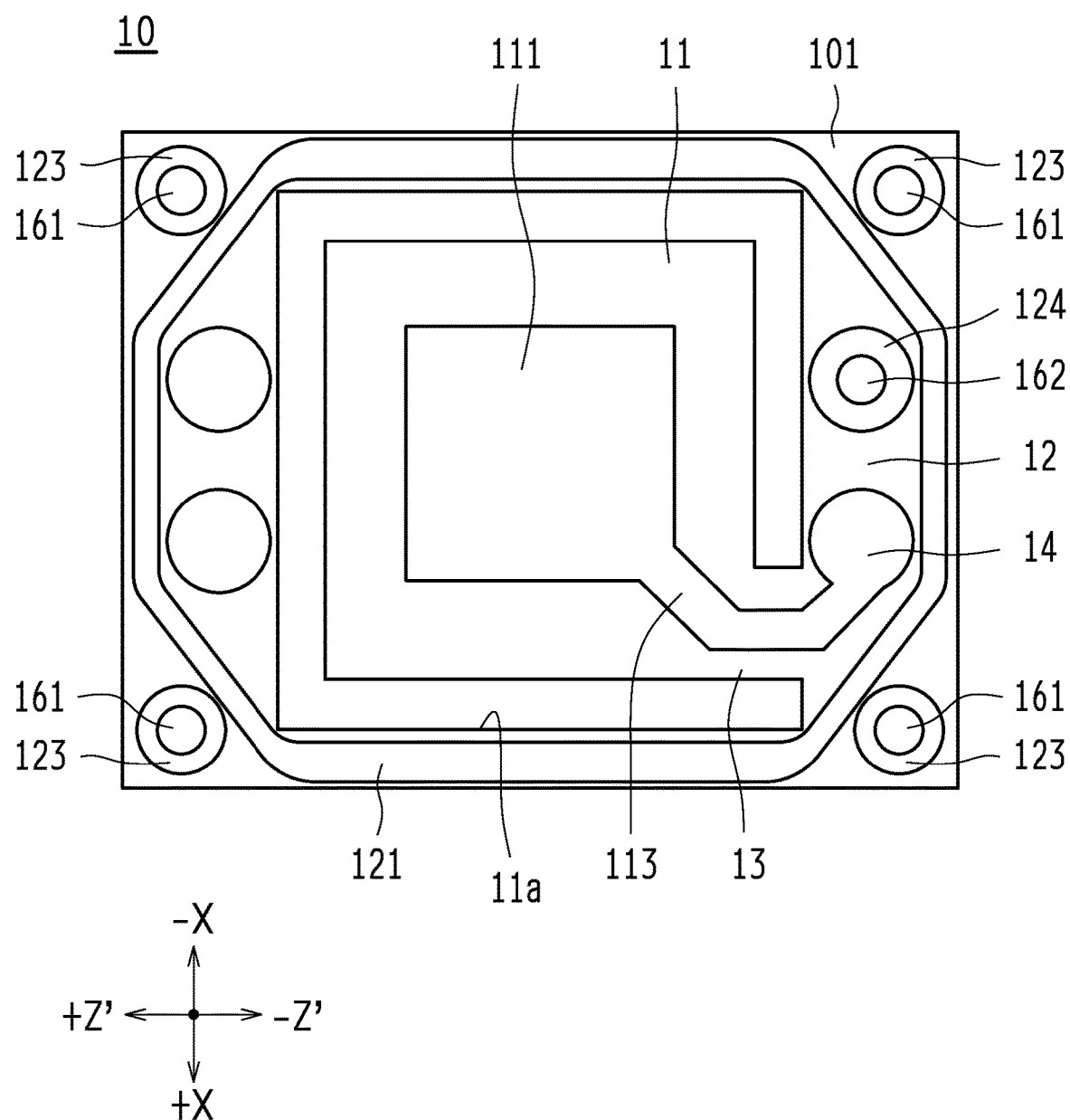
FIG. 7 is a schematic plan view illustrating a first main surface of a crystal resonator plate of the crystal oscillator of FIG. 4.
Figure 8:
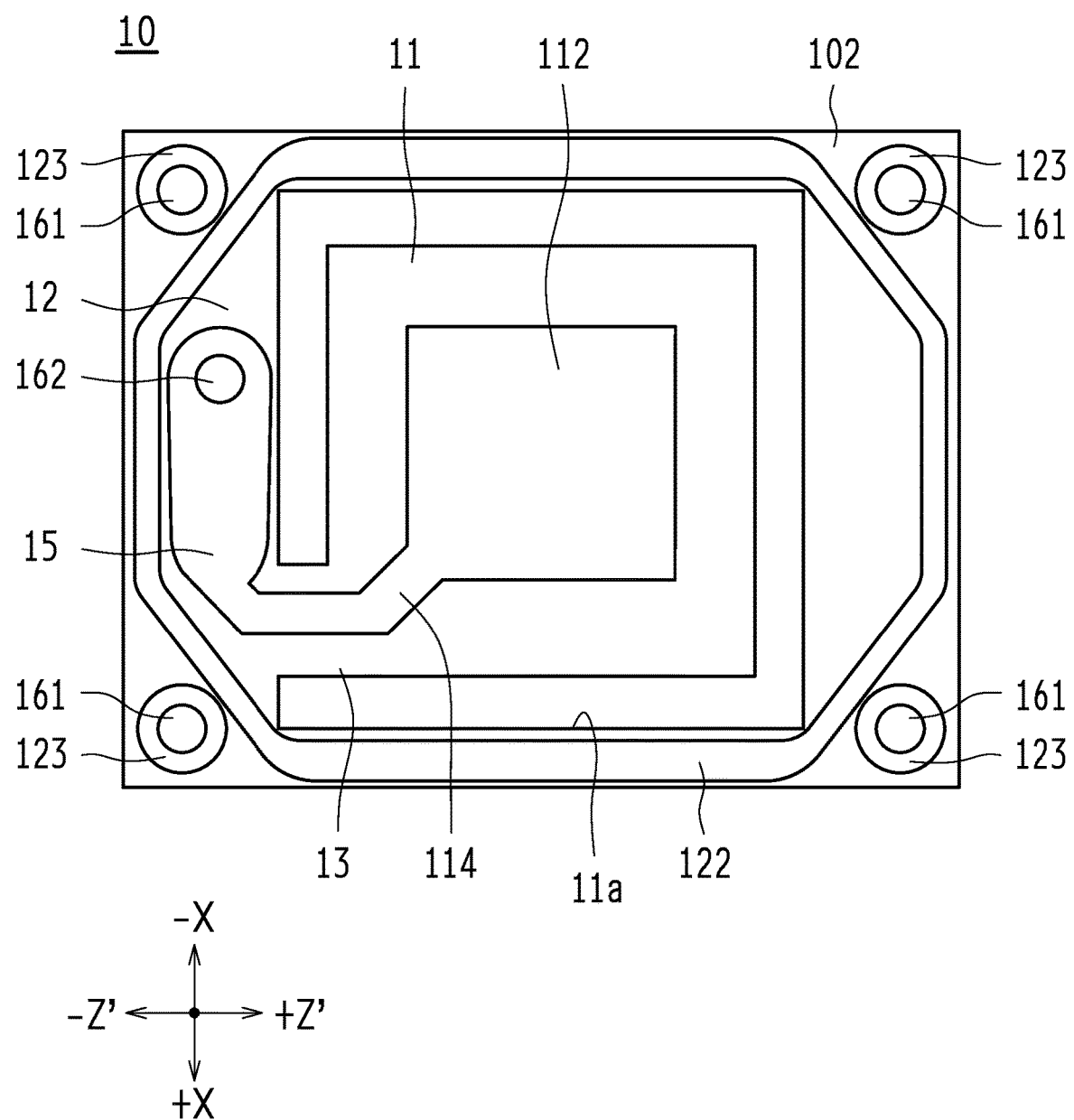
FIG. 8 is a schematic plan view illustrating a second main surface of the crystal resonator plate of the crystal oscillator of FIG. 4.

The crystal resonator plate 10 is a piezoelectric substrate made of crystal as shown in FIGS. 7 and 8. Each main surface (i.e. a first main surface 101 and a second main surface 102) is formed as a smooth flat surface (mirror-finished). An AT-cut crystal plate that causes thickness shear vibration is used as the crystal resonator plate 10. In the crystal resonator plate 10 shown in FIGS. 7 and 8, each main surface 101 and 102 of the crystal resonator plate 10 is an XZ' plane. On this XZ' plane, the direction parallel to the lateral direction (short side direction) of the crystal resonator plate 10 is the X axis direction, and the direction parallel to the longitudinal direction (long side direction) of the crystal resonator plate 10 is the Z' axis direction.

A pair of excitation electrodes (i.e. a first excitation electrode 111 and a second excitation electrode 112) is formed, respectively, on the main surfaces 101 and 102 of the crystal resonator plate 10. The crystal resonator plate 10 includes: the vibrating part 11 formed so as to have a substantially rectangular shape; an external frame part 12 surrounding the outer periphery of the vibrating part 11; and a support part 13 that supports the vibrating part 11 by connecting the vibrating part 11 to the external frame part 12. That is, the crystal resonator plate 10 has a configuration in which the vibrating part 11, the external frame part 12 and the support part 13 are integrally formed. The support part 13 extends (protrudes) from only one corner part positioned in the +X direction and in the −Z' direction of the vibrating part 11 to the external frame part 12 in the −Z' direction. A penetrating part (slit) 11a is formed between the vibrating part 11 and the external frame part 12. The vibrating part 11 and the external frame part 12 are connected by only one support part 13.

The first excitation electrode 111 is provided on the first main surface 101 side of the vibrating part 11 while the second excitation electrode 112 is provided on the second main surface 102 side of the vibrating part 11. The first excitation electrode 111 and the second excitation electrode 112 are respectively connected to lead-out wirings (a first lead-out wiring 113 and a second lead-out wiring 114) so that these excitation electrodes are connected to external electrode terminals. The first lead-out wiring 113 is drawn from the first excitation electrode 111 and connected to a connection bonding pattern 14 formed on the external frame part 12 via the support part 13. The second lead-out wiring 114 is drawn from the second excitation electrode 112 and connected to a connection bonding pattern 15 formed on the external frame part 12 via the support part 13.

Resonator-plate-side sealing parts to bond the crystal resonator plate 10 respectively to the first sealing member 20 and the second sealing member 30 are provided on the respective main surfaces (i.e. the first main surface 101 and the second main surface 102) of the crystal resonator plate 10. As the resonator-plate-side sealing part on the first main surface 101, a resonator-plate-side first bonding pattern 121 is formed. As the resonator-plate-side sealing part on the second main surface 102, a resonator-plate-side second bonding pattern 122 is formed. The resonator-plate-side first bonding pattern 121 and the resonator-plate-side second bonding pattern 122 are each formed on the external frame part 12 so as to have an annular shape in plan view.

Also, as shown in FIGS. 7 and 8, five through holes are formed in the crystal resonator plate 10 so as to penetrate between the first main surface 101 and the second main surface 102. More specifically, four first through holes 161 are respectively disposed in the four corners (corner parts) of the external frame part 12. A second through hole 162 is disposed in the external frame part 12, on one side in the Z' axis direction relative to the vibrating part 11 (in FIGS. 7 and 8, on the side of the −Z' direction). Connection bonding patterns 123 are formed on the respective peripheries of the first through holes 161. Also, on the periphery of the second through hole 162, a connection bonding pattern 124 is formed on the first main surface 101 side while the connection bonding pattern 15 is formed on the second main surface 102 side.

In the first through holes 161 and the second through hole 162, through electrodes are respectively formed along a corresponding inner wall surface of the above through holes so as to establish conduction between the electrodes formed on the first main surface 101 and the second main surface 102. Respective center parts of the first through holes 161 and the second through hole 162 are hollow penetrating parts penetrating between the first main surface 101 and the second main surface 102.

Figure 5:
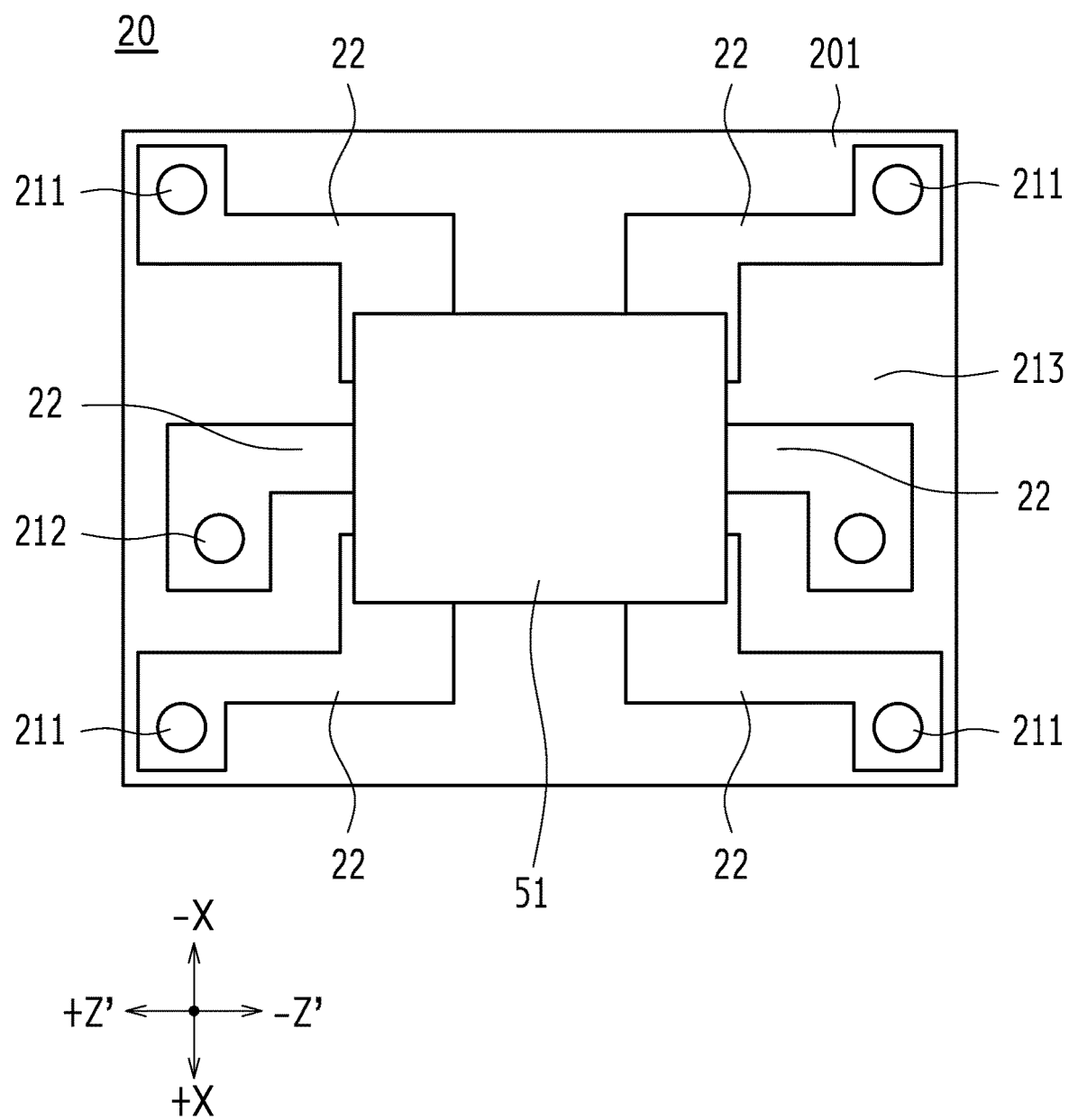
FIG. 5 is a schematic plan view illustrating a first main surface of a first sealing member of the crystal oscillator of FIG. 4.
Figure 6:
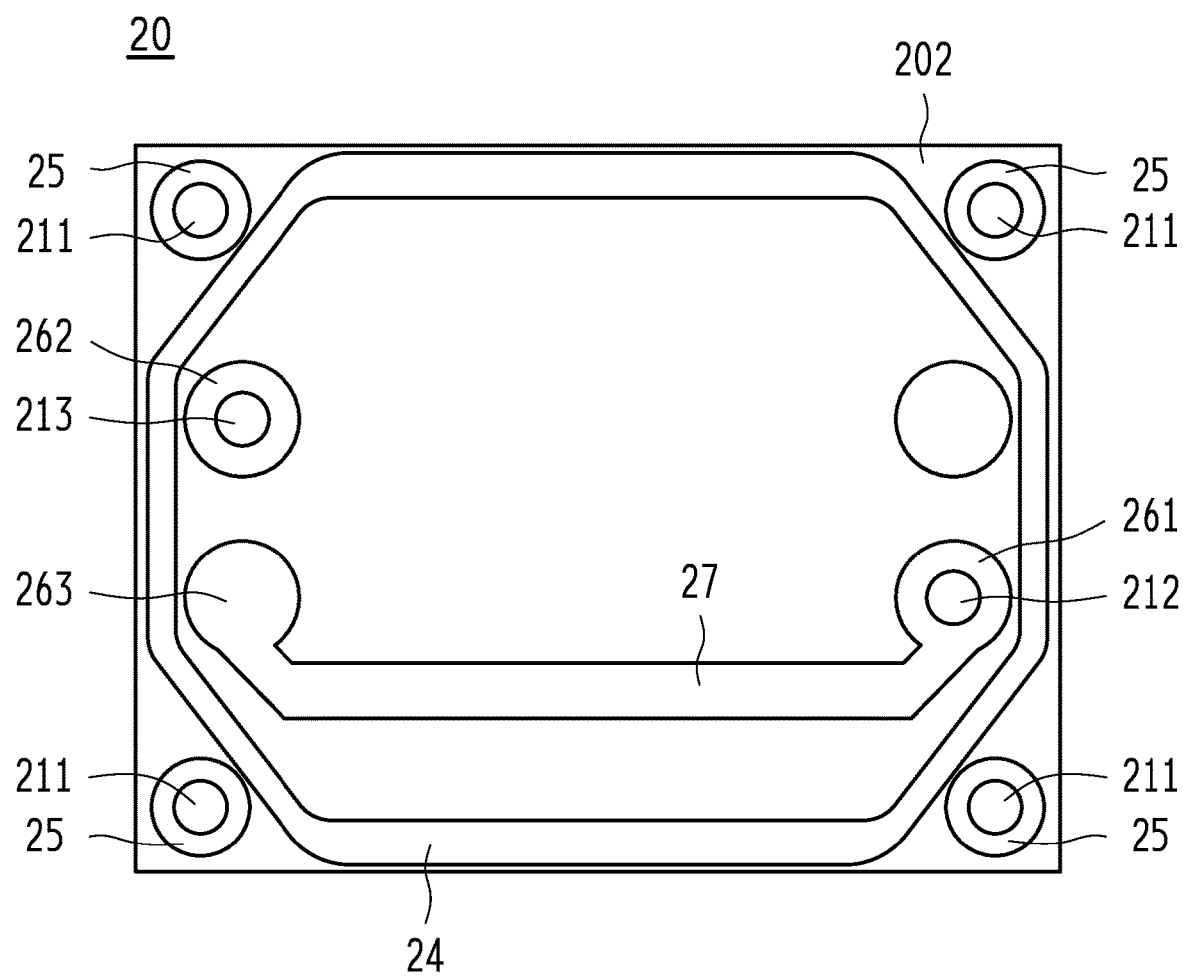
FIG. 6 is a schematic plan view illustrating a second main surface of the first sealing member of the crystal oscillator of FIG. 4.

As shown in FIGS. 5 and 6, the first sealing member 20 is a substrate having a rectangular parallelepiped shape that is made of a single AT-cut crystal plate. A second main surface 202 (a surface to be bonded to the crystal resonator plate 10) of the first sealing member 20 is formed as a smooth flat surface (mirror finished). By making the first sealing member 20, which does not have the vibrating part, of the AT-cut crystal plate as in the case of the crystal resonator plate 10, it is possible for the first sealing member 20 to have the same coefficient of thermal expansion as the crystal resonator plate 10. Thus, it is possible to prevent thermal deformation of the crystal oscillator 100. Furthermore, the respective directions of the X axis, Y axis and Z' axis of the first sealing member 20 are the same as those of the crystal resonator plate 10.

As shown in FIG. 5, on a first main surface 201 of the first sealing member 20, six electrode patterns 22 are formed, which include mounting pads for mounting the oscillator IC 51 as an oscillation circuit element. The oscillator IC 51 is bonded to the electrode patterns 22 by the flip chip bonding (FCB) method using the metal bumps (for example, Au bumps) 51a (see FIG. 4).

As shown in FIGS. 5 and 6, six through holes are formed in the first sealing member 20 so as to be respectively connected to the six electrode patterns 22 and also to penetrate between the first main surface 201 and the second main surface 202. More specifically, four third through holes 211 are respectively disposed in the four corners (corner parts) of the first sealing member 20. Fourth and fifth through holes 212 and 213 are disposed respectively in the +Z' direction and in the −Z' direction in FIGS. 5 and 6.

In the third through holes 211 and the fourth and fifth through holes 212 and 213, through electrodes are respectively formed along a corresponding inner wall surface of the above through holes so as to establish conduction between the electrodes formed on the first main surface 201 and the second main surface 202. Respective center parts of the third through holes 211 and the fourth and fifth through holes 212 and 213 are hollow penetrating parts penetrating between the first main surface 201 and the second main surface 202.

On the second main surface 202 of the first sealing member 20, a sealing-member-side first bonding pattern 24 is formed as a sealing-member-side first sealing part so as to be bonded to the crystal resonator plate 10. The sealing-member-side first bonding pattern 24 is formed so as to have an annular shape in plan view.

On the second main surface 202 of the first sealing member 20, connection bonding patterns 25 are respectively formed on the peripheries of the third through holes 211. A connection bonding pattern 261 is formed on the periphery of the fourth through hole 212, and a connection bonding pattern 262 is formed on the periphery of the fifth through hole 213. Furthermore, a connection bonding pattern 263 is formed on the side opposite to the connection bonding pattern 261 in the long axis direction of the first sealing member 20 (i.e. on the side of the −Z' direction). The connection bonding pattern 261 and the connection bonding pattern 263 are connected to each other via a wiring pattern 27.

Figure 9:
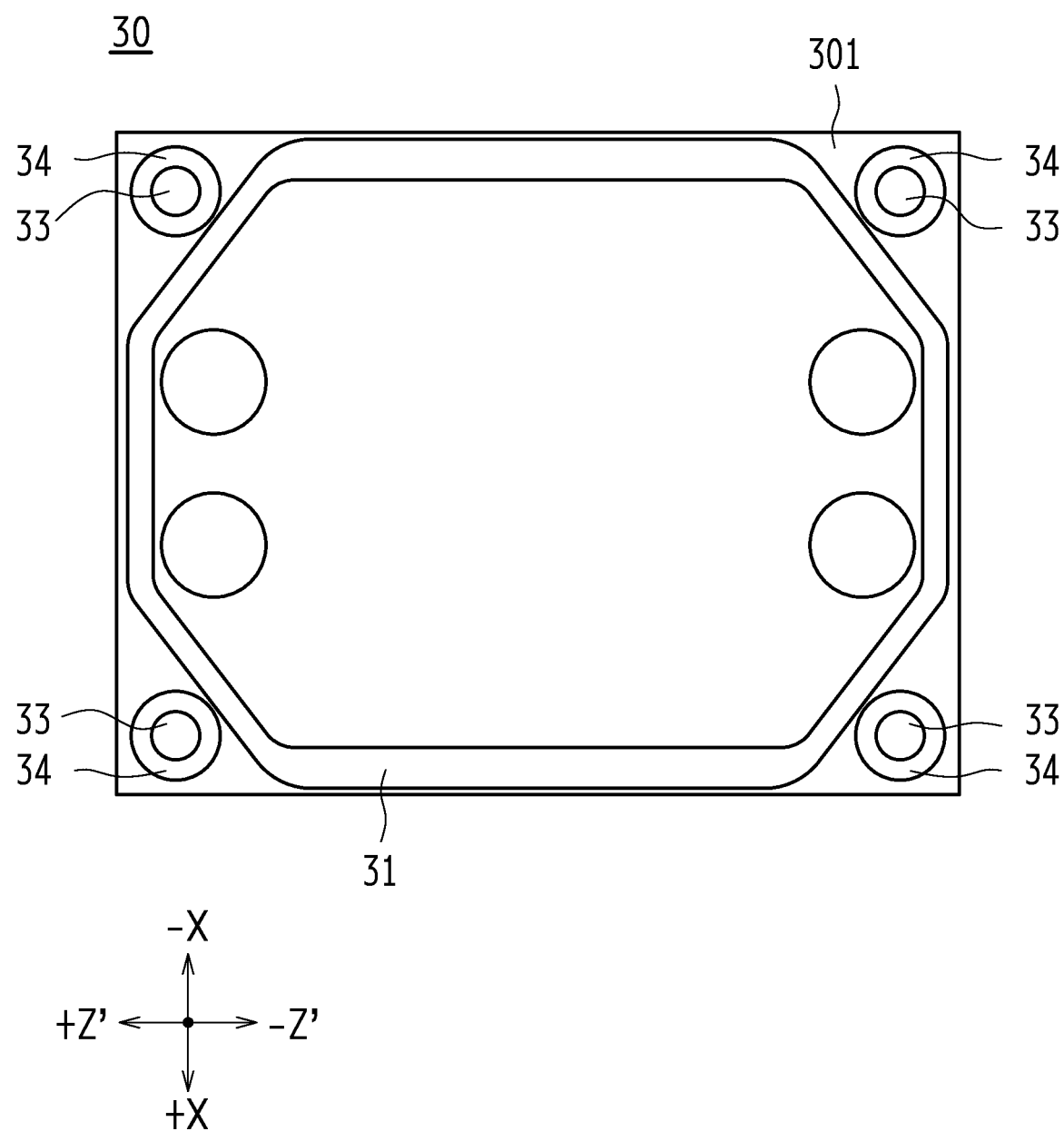
FIG. 9 is a schematic plan view illustrating a first main surface of a second sealing member of the crystal oscillator of FIG. 4.
Figure 10:
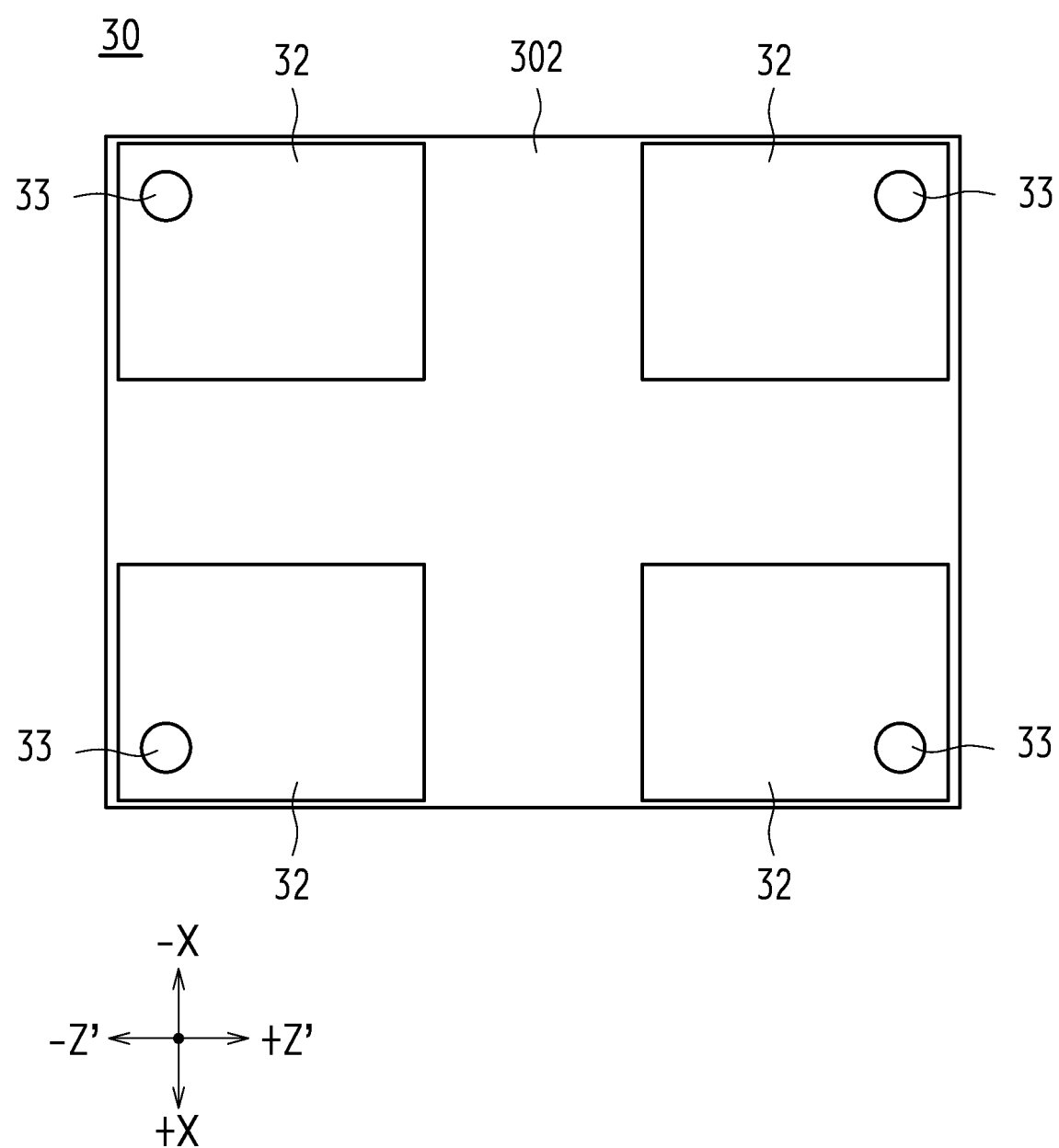
FIG. 10 is a schematic plan view illustrating a second main surface of the second sealing member of the crystal oscillator of FIG. 4.

As shown in FIGS. 9 and 10, the second sealing member 30 is a substrate having a rectangular parallelepiped shape that is made of a single AT-cut crystal plate. A first main surface 301 (a surface to be bonded to the crystal resonator plate 10) of the second sealing member 30 is formed as a smooth flat surface (mirror finished). The second sealing member 30 is also preferably made of an AT-cut crystal plate as in the case of the crystal resonator plate 10, and the respective directions of the X axis, Y axis and Z' axis of the second sealing member 30 are preferably the same as those of the crystal resonator plate 10.

On the first main surface 301 of the second sealing member 30, a sealing-member-side second bonding pattern 31 is formed as a sealing-member-side second sealing part so as to be bonded to the crystal resonator plate 10. The sealing-member-side second bonding pattern 31 is formed so as to have an annular shape in plan view.

On a second main surface 302 of the second sealing member 30, four external electrode terminals 32 are formed, which are electrically connected, via solder or the like, to the crystal substrate 54 as described above. The external electrode terminals 32 are respectively located on the four corners (corner parts) on the second main surface 302 of the second sealing member 30. The external electrode terminals 32 are electrically connected to the external terminals (not shown) formed on the bottom surface of the crystal substrate 54, and furthermore electrically connected to the outside via the interposer 4 and the package 2 as described above.

As shown in FIGS. 9 and 10, four through holes are formed in the second sealing member 30 so as to penetrate between the first main surface 301 and the second main surface 302. More specifically, four sixth through holes 33 are respectively disposed in the four corners (corner parts) of the second sealing member 30. In the sixth through holes 33, through electrodes are respectively formed along a corresponding inner wall surface of the sixth through holes 33 so as to establish conduction between the electrodes formed on the first main surface 301 and the second main surface 302. In this way, the respective electrodes formed on the first main surface 301 are electrically conducted to the external electrode terminals 32 formed on the second main surface 302 via the through electrodes formed along the inner wall surfaces of the sixth through holes 33. Also, respective central parts of the sixth through holes 33 are hollow penetrating parts 333 penetrating between the first main surface 301 and the second main surface 302. On the first main surface 301 of the second sealing member 30, connection bonding patterns 34 are respectively formed on the peripheries of the sixth through holes 33.

In the crystal oscillator 100 including the crystal resonator plate 10, the first sealing member 20 and the second sealing member 30, the crystal resonator plate 10 and the first sealing member 20 are subjected to the diffusion bonding in a state in which the resonator-plate-side first bonding pattern 121 and the sealing-member-side first bonding pattern 24 are superimposed on each other, and the crystal resonator plate 10 and the second sealing member 30 are subjected to the diffusion bonding in a state in which the resonator-plate-side second bonding pattern 122 and the sealing-member-side second bonding pattern 31 are superimposed on each other, thus, the package having the sandwich structure as shown in FIG. 4 is produced. Accordingly, the internal space of the package, i.e. the space to house the vibrating part 11 is hermetically sealed.

In this case, the respective connection bonding patterns as described above are also subjected to the diffusion bonding in a state in which they are each superimposed on the corresponding connection bonding pattern. Such bonding between the connection bonding patterns allows electrical conduction of the first excitation electrode 111, the second excitation electrode 112, the oscillator IC 51 and the external electrode terminals 32 of the crystal oscillator 100.

More specifically, the first excitation electrode 111 is connected to the oscillator IC 51 via the first lead-out wiring 113, the wiring pattern 27, the fourth through hole 212 and the electrode pattern 22 in this order. The second excitation electrode 112 is connected to the oscillator IC 51 via the second lead-out wiring 114, the second through hole 162, the fifth through hole 213 and the electrode pattern 22 in this order. Also, the oscillator IC 51 is connected to the external electrode terminals 32 via the electrode patterns 22, the third through holes 211, the first through holes 161 and the sixth through holes 33 in this order.

In the crystal oscillator 100, the bonding patterns are each preferably made of a plurality of layers laminated on the crystal plate, specifically, a Ti (titanium) layer and an Au (gold) layer deposited by the vapor deposition in this order from the lowermost layer side. Also, the other wirings and electrodes formed on the crystal oscillator 100 each preferably have the same configuration as the bonding patterns, which leads to patterning of the bonding patterns, the wirings and the electrodes at the same time.

In the above-described crystal oscillator 100, sealing parts (seal paths) 115 and 116 that hermetically seal the vibrating part 11 of the crystal resonator plate 10 are formed so as to have an annular shape in plan view. The seal path 115 is formed by the diffusion bonding of the resonator-plate-side first bonding pattern 121 and the sealing-member-side first bonding pattern 24 as described above. The outer edge and the inner edge of the seal path 115 both have a substantially octagonal shape. In the same way, the seal path 116 is formed by the diffusion bonding of the resonator-plate-side second bonding pattern 122 and the sealing-member-side second bonding pattern 31 as described above. The outer edge and the inner edge of the seal path 116 both have a substantially octagonal shape.

In this embodiment as described above, the core section 5 is supported by the package 2 via the interposer 4, and hermetically encapsulated in the package 2. Thus, since the current to be applied to the thin-film heaters 56a and 56b is controlled via the heater IC 52, the temperature of the space sandwiched between the upper and lower thin-film heaters 56a and 56b (i.e. a temperature controlled space) can be adjusted.

In the temperature controlled space sandwiched between the upper and lower thin-film heaters 56a and 56b in this embodiment, the temperature of the crystal resonator 50, the oscillator IC 51 and the heater IC 52 can be accurately adjusted (so as to have a constant temperature). Also, since the core section 5 is encapsulated in the package 2, it is possible to reduce temperature change of the crystal resonator 50 of the core section 5 as much as possible even when the outside temperature changes. Thus, the temperature adjustment by the OCXO 1 can be performed in the small temperature range, which leads to simple components required for temperature adjustment and thus results in reduction in costs. Furthermore, since the heater IC 52 that mainly controls the temperature of the thin-film heaters 56a and 56b is used together with the oscillator IC 51 that mainly controls the piezoelectric vibration of the crystal resonator 50, the temperature adjustment of the thin-film heaters 56a and 56b as well as the piezoelectric vibration control of the crystal resonator 50 can be both performed with high accuracy. As a result, it is possible to remarkably reduce the costs compared to the case where an IC (for example, an OCXO-IC) capable of performing both the temperature adjustment of the thin-film heaters 56a and 56b and the piezoelectric vibration control of the crystal resonator 50 is used.

In this embodiment, the package 2 includes the recess part 2a whose upper part is opened, and the core section 5 is supported by the interposer 4 so as to be hung inside the package 2. Thus, it is possible to reduce the height of the OCXO 1 by supporting the core section 5 in the package 2 using the interposer 4. Consequently, it is possible to reduce the heat capacity of the OCXO 1, which leads to the temperature adjustment with high accuracy by the OCXO 1.

More specifically, a pair of step parts 2c facing each other is formed inside the package 2. The interposer 4 is disposed so as to be bridged between the pair of step parts 2c. The core section 5 is disposed so as to be housed in the space between the pair of step parts 2c. In this way, it is possible to easily fix the interposer 4 to the package 2 using the step parts 2c of the package 2. Also, it is possible to further reduce the height of the OCXO 1 by housing the core section 5 in the space between the pair of step parts 2c in the package 2. Consequently, it is possible to reduce the heat capacity of the OCXO 1, which leads to the temperature adjustment with high accuracy by the OCXO 1.

The package 2 suffers heat damage and over time damage due to hermetical sealing, aging, deterioration over time and the like. Thus, when a resin adhesive with low heat resistance is used as the conductive adhesives 6 and 7, it may generate gas in the package 2 by decomposition or softening, which may affect high accuracy in the temperature adjustment by the OCXO 1. In this embodiment taking into account the above, a polyimide adhesive or an epoxy adhesive with low thermal conductivity and high heat resistance is used as the conductive adhesives 6 and 7 so as to prevent the above problems.

Furthermore in this embodiment, the crystal resonator 50 having the sandwich structure is used as the piezoelectric resonator, which hermetically seals the vibrating part 11 in the inside and is capable of having a reduced height. Thus, it is possible to further reduce the height and the size of the core section 5. Accordingly, the heat capacity of the core section 5 can be reduced, which leads to the temperature adjustment with high accuracy by the OCXO 1. The thickness of the crystal resonator 50 is, for example, 0.12 mm, which is very thin compared to the thickness of the conventional crystal resonators. Thus, the heat capacity of the core section 5 can be further decreased compared to the conventional OCXO, which suppresses the heater calorific value of the OCXO 1 including such a core section 5. Therefore, it is possible to contribute to low power consumption. Furthermore, the temperature followability of the core section 5 can be improved, which also improves the stability of the OCXO 1. In addition, in the crystal resonator 50 having the sandwich structure, the vibrating part 11 is hermetically sealed without using any adhesive, as described above. Thus, it is possible to prevent thermal convection by outgas generated by the adhesive from affecting. That is, when the adhesive is used, the thermal convection may be generated, in the space in which the vibrating part 11 is hermetically sealed, by circulation of outgas generated by the adhesive, which may prevent the temperature of the vibrating part 11 from being accurately adjusted. However, the crystal resonator 50 having three-plate-layered structure does not generate outgas. Thus, it is possible to accurately control the temperature of the vibrating part 11.

Also, in the crystal resonator 50 having the sandwich structure, the seal paths 115 and 116, and the bonding members formed by bonding the respective connection bonding patterns as described above are constituted of thin-film metal layers. Thus, thermal conduction in the vertical direction (layered direction) of the crystal resonator 50 is ameliorated, which contributes to quick homogenization of the temperature of the crystal resonator 50. In the case of the seal paths 115 and 116, the thickness of the thin-film metal layers is not more than 1.00 μm (specifically, the thickness in the Au—Au bonding in this embodiment is 0.15 to 1.00 μm), which is very thin compared to the conventional metal paste sealing material containing Sn (having, for example, the thickness of 5 to 20 μm). Therefore, the thermal conduction in the vertical direction (layered direction) of the crystal resonator 50 is improved. Also, the crystal resonator plate 10 is bonded to the first sealing member 20 by the plurality of bonding regions and furthermore the crystal resonator plate 10 is bonded to the second sealing member 30 by the plurality of bonding regions, which also improves the thermal conduction in the vertical direction (layered direction) of the crystal resonator 50.

In this embodiment, the penetrating part 11a is formed between the vibrating part 11 and the external frame part 12 of the crystal resonator plate 10. The vibrating part 11 and the external frame part 12 are connected by only one support part 13. The support part 13 extends from only one corner part positioned in the +X direction and in the −Z' direction of the vibrating part 11 to the external frame part 12 in the −Z' direction. Thus, since the support part 13 is disposed on the corner part where displacement of the piezoelectric vibration is relatively small in an outer peripheral edge part of the vibrating part 11, it is possible to prevent leakage of the piezoelectric vibration to the external frame part 12 via the support part 13 compared to the case in which the support part 13 is provided on the position other than the corner part (i.e. central part of the respective sides). Thus, the vibrating part 11 is piezoelectrically vibrated more effectively. It is also possible to reduce stress applied to the vibrating part 11 compared to the case in which two or more support parts 13 are provided. Thus, it is possible to reduce frequency shift of the piezoelectric vibration caused by the stress. Accordingly, it is possible to improve the stability of the piezoelectric vibration.

The present invention may be embodied in other forms without departing from the gist or essential characteristics thereof. The foregoing embodiment is therefore to be considered in all respects as illustrative and not limiting. The scope of the invention is indicated by the appended claims rather than by the foregoing description, and all modifications and changes that come within the meaning and range of equivalency of the claims are intended to be embraced therein.

In the above-described embodiment, the crystal resonator 50 having the sandwich structure is used as the piezoelectric resonator. However, the present invention is not limited thereto. A piezoelectric resonator having another structure may also be used. Furthermore, the oscillator IC 51 and the heater IC 52 are mounted by the FCB method using the metal bumps. However, the present invention is not limited thereto. The oscillator IC 51 and the heater IC 52 may be mounted by wire bonding method.

In the above-described embodiment, the thin-film heaters 56a and 56b are used as the heater substrate. However, the present invention is not limited thereto. The temperature of the core section 5 may be adjusted by a heater having a configuration other than the above. Also, the number of heaters to be installed is not particularly limited. However, from the viewpoint of reduction in the height and the size of the core section 5, it is preferable to use the thin-film heaters 56a and 56b as the heater substrate. Note that the calorific value generated by the heater IC 52 disposed inside the core section 5 is also relatively large. Therefore, it is also possible to use the heater IC 52 as a heat source for adjusting the temperature of the core section 5.

Also in the above-described embodiment, the core section 5 has a configuration in which the crystal resonator 50, the oscillator IC 51, the heater IC 52 and the chip capacitors 53b and 53c are sandwiched between the upper and lower two thin-film heaters 56a and 56b. However, it is sufficient to package the electronic components used in the OCXO 1. Thus, the core section 5 having a configuration other than the above may be hermetically encapsulated in the package. The temperature characteristics of the chip capacitors 53a to 53c are smaller than those of the crystal resonator 50, the oscillator IC 51 and the heater IC 52. Therefore, it is not necessary to dispose all the chip capacitors 53a to 53c between the upper and lower thin-film heaters 56a and 56b. Also, the number of the chip capacitors to be disposed is not particularly limited.

Figure 11:
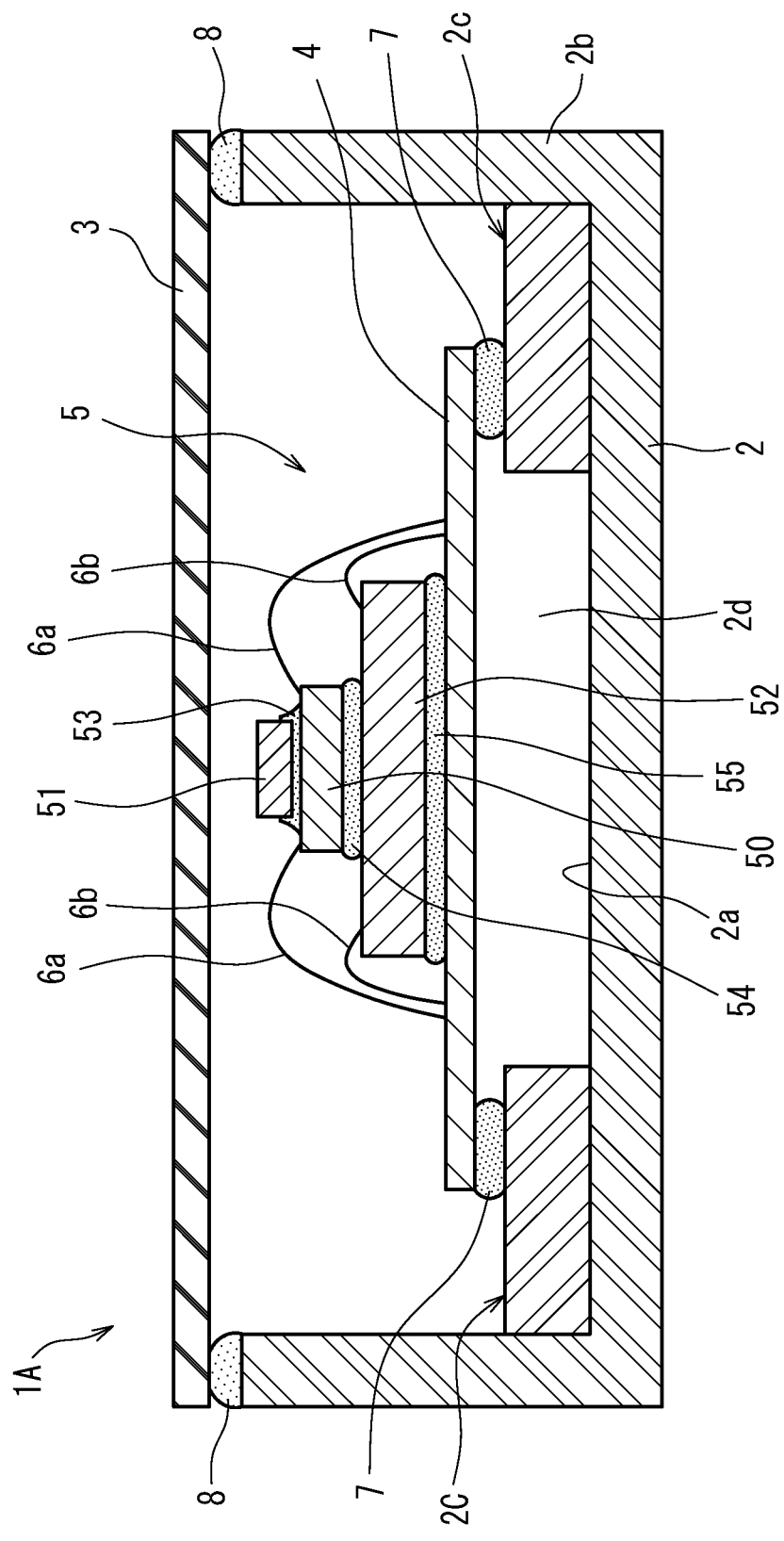
FIG. 11 is a cross-sectional view illustrating a schematic configuration of an OCXO according to a variation.
Figure 12:
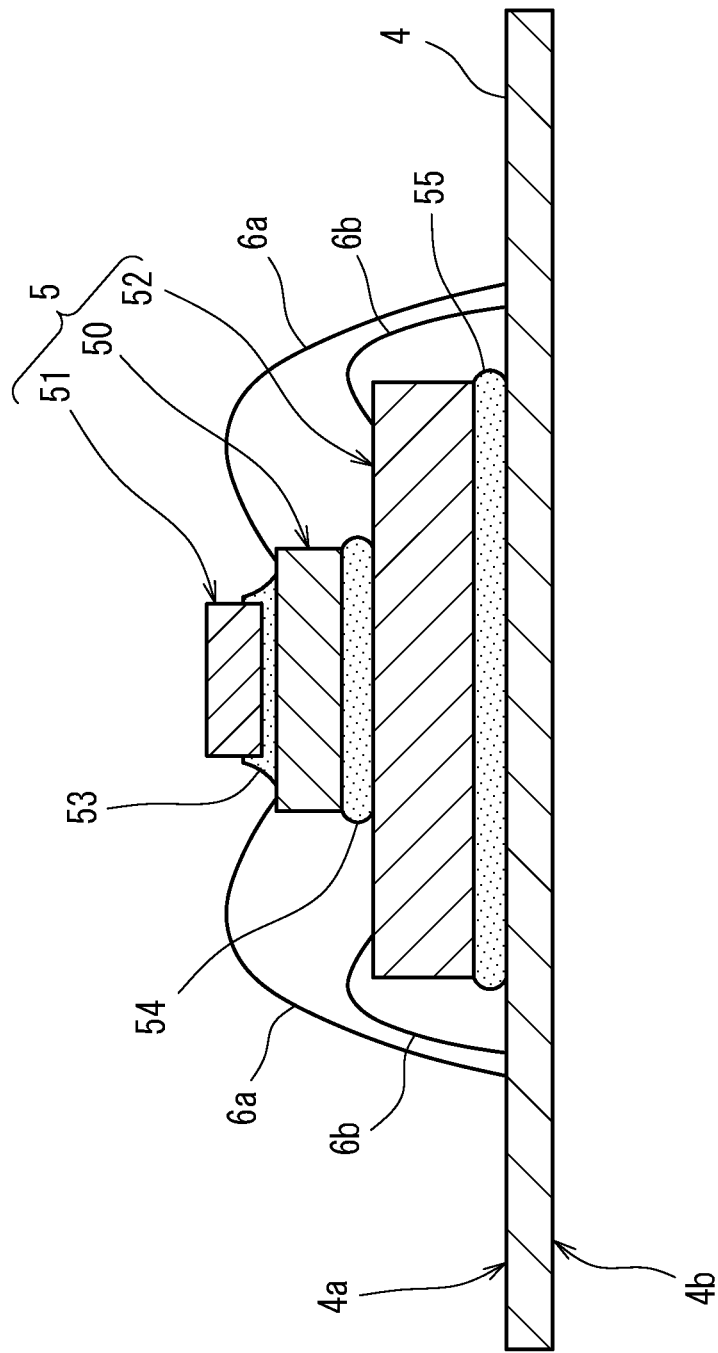
FIG. 12 is a cross-sectional view illustrating a schematic configuration of a core section and a core substrate of the OCXO of FIG. 11.
Figure 13:
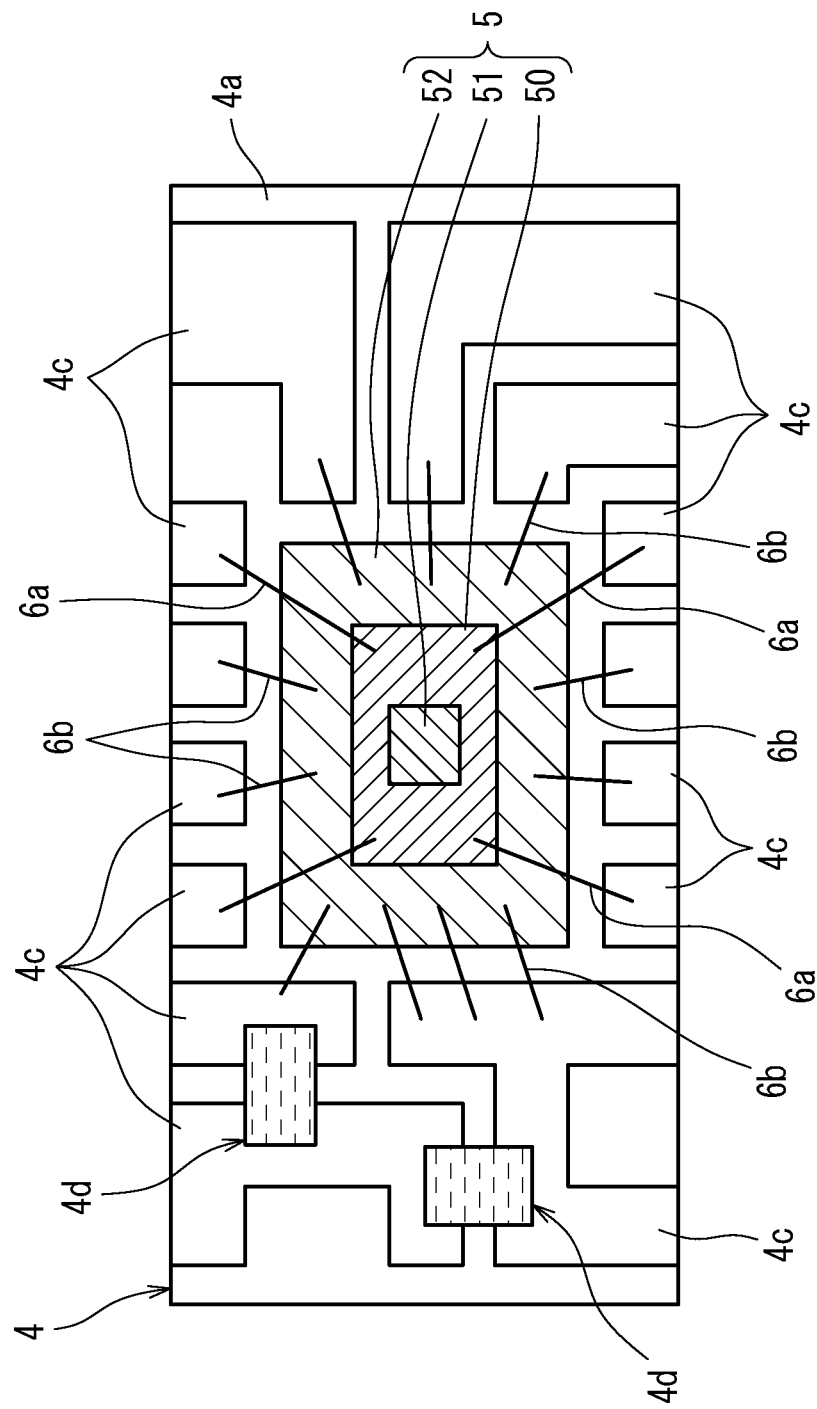
FIG. 13 is a plan view illustrating the core section and the core substrate of FIG. 12.

In the above-described embodiment, the core section 5 includes the crystal resonator 50, the oscillator IC 51, the heater substrate, the heater IC 52, and the plurality of capacitors. However, the core section 5 may include the crystal resonator 50, the oscillator IC 51, and the heater IC 52. For example, as shown in FIGS. 11 to 13, the core section 5 has a three-layer structure (layered structure) in which the oscillator IC 51, the crystal resonator 50 and the heater IC 52 are laminated in this order from the uppermost layer side. The rear surface of the heater IC 52 is bonded to the front surface of the interposer 4. With this configuration, in addition to the heater IC 52, the oscillator IC 51 also serves as the heating element. Thus, since the heating elements are respectively provided on the upper side and the lower side of the crystal resonator 50, the crystal resonator 50 can be uniformly heated from above and below.

Thus, it is sufficient for the core section 5 to include, as its components, at least the crystal resonator 50, the oscillator IC 51, and the heater IC 52. The heater substrate may be omitted when the heater IC 52 is used as a heat source. Specifically, it is preferable to use the heater IC 52 that has a configuration in which a heating element (a heat source), a control circuit for controlling the temperature of the heating element (a current control circuit) and a temperature sensor for detecting the temperature of the heating element are integrally formed. Also, the plurality of capacitors may be provided as members separated from the core section 5. The plurality of capacitors may be housed in the space of the package 2 where the core section 5 is housed, or may be housed in a space other than that where the core section 5 is housed.

Here, an OCXO 1A is described referring to FIGS. 11 to 13. In the OCXO 1A of this variation, the core section 5 has a three-layer structure (layered structure) in which the oscillator IC 51, the crystal resonator 50 and the heater IC 52 are laminated in this order from the uppermost layer side. The core section 5 is disposed in the package 2, and is hermetically sealed by a lid 3.

More specifically, the step parts 2c are formed on the inner wall surface of the peripheral wall part 2b of the package 2 so as to be along the arrangement of connection terminals (not shown). The core section 5 is connected to the connection terminals formed on the step parts 2c via the plate-like interposer (core substrate) 4. The interposer 4 is disposed so as to be bridged between the facing pair of step parts 2c of the package 2. A space 2d is formed under the interposer 4, between the pair of step parts 2c. The connection terminals formed on the step surfaces of the step parts 2c are connected to connection terminals (not shown) formed on a rear surface 4b of the interposer 4 via the conductive adhesive 7. Also, external terminals (not shown) formed on the respective components of the core section 5 are connected to connection terminals 4c formed on the front surface 4a of the interposer 4, by wire bonding via wires 6a and 6b. A polyimide adhesive or an epoxy adhesive is used, for example, as the conductive adhesive 7.

In FIGS. 12 and 13, the core section 5 is mounted on the interposer 4. The oscillator IC 51, the crystal resonator 50 and the heater IC 52 of the core section 5 respectively have areas in plan view that become gradually smaller from the downside to the upside. The electronic components of the core section 5 are not sealed by the sealing resin, however, depending on the sealing atmosphere, the electronic components may be sealed by the sealing resin. The crystal oscillator 100 is constituted of the crystal resonator 50 and the oscillator IC 51, and the configuration of the crystal oscillator 100 is the same as that of the above-described embodiment (see FIGS. 4 to 10).

Between the facing surfaces of the crystal resonator 50 and the oscillator IC 51, a non-conductive adhesive (underfill) 53 is interposed, which fixes the respective facing surfaces of the crystal resonator 50 and the oscillator IC 51 to each other. In this case, the front surface (the first main surface 201 of the first sealing member 20) of the crystal resonator 50 is bonded to the rear surface of the oscillator IC 51 via the non-conductive adhesive 53. As the non-conductive adhesive 53, a polyimide adhesive or an epoxy adhesive is, for example, used. Also, external terminals (the electrode patterns 22 shown in FIG. 5) formed on the front surface of the crystal resonator 50 are connected to the connection terminals 4c formed on the front surface 4a of the interposer 4, by wire bonding via the wires 6a.

The oscillator IC 51 has the area smaller than the area of the crystal resonator 50 in plan view. Thus, the whole oscillator IC 51 is disposed within the area of the crystal resonator 50 in plan view. Also, all the rear surface of the oscillator IC 51 is bonded to the front surface (the first main surface 201 of the first sealing member 20) of the crystal resonator 50.

The heater IC 52 has a configuration in which the heating element (the heat source), the control circuit for controlling the temperature of the heating element (the current control circuit) and the temperature sensor for detecting the temperature of the heating element are integrally formed. By controlling the temperature of the core section 5 by the heater IC 52, it is possible to keep the temperature of the core section 5 substantially constant, which contributes to stabilization of the oscillation frequency of the OCXO 1 A.

Between the facing surfaces of the crystal resonator 50 and the heater IC 52, a non-conductive adhesive (underfill) 54 is interposed, which fixes the respective facing surfaces of the crystal resonator 50 and the heater IC 52 to each other. In this case, the rear surface (the second main surface 302 of the second sealing member 30) of the crystal resonator 50 is bonded to the front surface of the heater IC 52 via the non-conductive adhesive 54. As the non-conductive adhesive 54, a polyimide adhesive or an epoxy adhesive is, for example, used. Also, external terminals (not shown) formed on the front surface of the heater IC 52 are connected to the connection terminals 4c formed on the front surface 4a of the interposer 4, by wire bonding via the wires 6b.

The crystal resonator 50 has the area smaller than the area of the heater IC 52 in plan view. Thus, the whole crystal resonator 50 is disposed within the area of the heater IC 52 in plan view. Also, all the rear surface of the crystal resonator 50 (the second main surface 302 of the second sealing member 30) is bonded to the front surface of the heater IC 52.

Between the facing surfaces of the heater IC 52 and the interposer 4, a conductive adhesive 55 is interposed, which fixes the respective facing surfaces of the heater IC 52 and the interposer 4 to each other. In this case, the rear surface of the heater IC 52 is bonded to the front surface 4a of the interposer 4 via the conductive adhesive 55. Thus, the heater IC 52 is connected to ground via the conductive adhesive 55 and the interposer 4. As the conductive adhesive 55, a polyimide adhesive or an epoxy adhesive is, for example, used. In the case where the heater IC 52 is connected to ground via wires or the like, a non-conductive adhesive such as the non-conductive adhesives 53 and 54 may be used in place of the conductive adhesive.

On the front surface 4a of the interposer 4, various connection terminals 4c are formed as described above. Also, on the front surface 4a of the core substrate 4, a plurality of (in FIG. 13, two) chip capacitors (bypass capacitors) 4d is disposed. However, the size or the number of the chip capacitors 4d is not particularly limited.

In the above-described embodiment and variation, the cases are described, in which the core section 5 is provided with the heater IC 52 and the thin-film heaters 56a and 56b (see FIGS. 1 to 3), and in which the core section 5 is provided with only the heater IC 52 (see FIGS. 11 to 13). However, the core section 5 may also be provided with only the thin-film heater. That is, the heating element provided in the core section 5 may be the heater IC and/or the thin-film heater. When the core section 5 is provided with only the thin-film heater, it is preferable that an IC for adjusting the temperature of the thin-film heater is provided separately from the core section 5.

The interposer (core substrate) 4 on which the core section 5 is mounted is not necessarily bonded to the front surfaces of the step parts 2c of the package 2. The interposer 4 may be bonded to the inner bottom surface of the recess part 2a by an adhesive. In this case, the heater IC 52 and the crystal resonator 50 are respectively bonded, directly, to the connection terminals of the front surfaces of the step parts 2c by wire bonding. With this configuration, it is possible to further reduce the height compared to the configuration in which the core section 5 is supported by the front surfaces of the step parts 2c via the interposer 4.

This application claims priority based on Patent Application No. 2020-060353 filed in Japan on Mar. 30, 2020. The entire contents thereof are hereby incorporated in this application by reference.

INDUSTRIAL APPLICABILITY

The present invention is suitably applied to an oven-controlled crystal oscillator including a core section having a piezoelectric resonator, an oscillator IC, and a heater IC.

DESCRIPTION OF REFERENCE NUMERALS

1 Oven-controlled crystal oscillator
2 Package
4 Interposer (core substrate)
5 Core section
50 Crystal resonator (piezoelectric resonator)
51 Oscillator IC
52 Heater IC
100 Crystal oscillator

The invention claimed is:

1. An oven-controlled crystal oscillator comprising a core section including a piezoelectric resonator, an oscillator IC and a heating element, wherein
   the core section comprises a layered structure in which the oscillator IC, the piezoelectric resonator and the heating element are laminated,
   the core section is supported by a package via a core substrate, and furthermore is hermetically encapsulated in the package,
   the core substrate is formed in a flat plate shape,
   the piezoelectric resonator includes: a first sealing member and a second sealing member both made of glass or crystal; and a piezoelectric resonator plate made of crystal,
   the piezoelectric resonator plate includes a vibrating part, on respective main surfaces of which excitation electrodes are formed, and
   the first sealing member and the second sealing member are laminated and bonded to each other via the piezoelectric resonator plate so as to hermetically seal the vibrating part of the piezoelectric resonator plate in an internal space.

2. The oven-controlled crystal oscillator according to claim 1, wherein
   the package is provided with a recess part whose upper part is opened, and
   the core section is supported by the core substrate so as to be hung inside the package.

3. The oven-controlled crystal oscillator according to claim 2, wherein
   a pair of step parts facing each other is formed inside the package,
   the core substrate is disposed so as to be bridged between the pair of step parts, and
   the core section is disposed so as to be housed in a space between the pair of step parts.

4. The oven-controlled crystal oscillator according to claim 3, wherein
   the core substrate is fixed to the pair of step parts via a polyimide conductive adhesive.

5. The oven-controlled crystal oscillator according to claim 1, wherein
   the heating element, the piezoelectric resonator and the oscillator IC are laminated in the recited order from the core substrate side.

6. An oven-controlled crystal oscillator comprising a core section including a piezoelectric resonator, an oscillator IC and a heating element, wherein
   the core section comprises a layered structure in which the oscillator IC, the piezoelectric resonator and the heating element are laminated, and
   the core section is supported by a package via a core substrate, and furthermore is hermetically encapsulated in the package, wherein
   the core section is supported by the package via only the core substrate,
   the piezoelectric resonator includes: a first sealing member and a second sealing member both made of glass or crystal; and a piezoelectric resonator plate made of crystal, the piezoelectric resonator plate includes a vibrating part, on respective main surfaces of which excitation electrodes are formed, and the first sealing member and the second sealing member are laminated and bonded to each other via the piezoelectric resonator plate so as to hermetically seal the vibrating part of the piezoelectric resonator plate in an internal space.

7. The oven-controlled crystal oscillator according to claim 6, wherein the package is provided with a recess part having an upper part that is opened, and the core section is supported by the core substrate so as to hang inside the package.

8. The oven-controlled crystal oscillator according to claim 7, wherein a pair of step parts facing each other is formed inside the package, the core substrate is disposed so as to be bridged between the pair of step parts, and the core section is disposed so as to be housed in a space between the pair of step parts.

9. The oven-controlled crystal oscillator according to claim 8, wherein the core substrate is fixed to the pair of step parts via a polyimide conductive adhesive.

10. The oven-controlled crystal oscillator according to claim 6, wherein the heating element, the piezoelectric resonator and the oscillator IC are laminated in the recited order from the core substrate side.

11. An oven-controlled crystal oscillator comprising a core section including a piezoelectric resonator, an oscillator IC and a heating element, wherein the core section comprises a layered structure in which the oscillator IC, the piezoelectric resonator and the heating element are laminated, the core section is supported by a package via a core substrate, and furthermore is hermetically encapsulated in the package, the core substrate is formed in a flat plate shape, the package is provided with a recess part whose upper part is opened, the core section is supported by the core substrate so as to be hung inside the package, a pair of step parts facing each other is formed inside the package, the core substrate is disposed so as to be bridged between the pair of step parts, and the core section is disposed so as to be housed in a space between the pair of step parts.

12. The oven-controlled crystal oscillator according to claim 11, wherein the core substrate is fixed to the pair of step parts via a polyimide conductive adhesive.

13. The oven-controlled crystal oscillator according to claim 11, wherein the heating element, the piezoelectric resonator and the oscillator IC are laminated in the recited order from the core substrate side.

\* \* \* \* \*